(12) United States Patent
Mottahed

(10) Patent No.: US 6,297,969 B1
(45) Date of Patent: *Oct. 2, 2001

(54) ELECTROMAGNETIC INTERFERENCE SHIELDING ENCLOSURE

(75) Inventor: Behzad Mottahed, Essex County, NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/371,514

(22) Filed: Aug. 10, 1999

(51) Int. Cl.[7] .................................................. H05K 9/00
(52) U.S. Cl. ........................ 361/818; 361/816; 361/752; 361/800
(58) Field of Search ..................... 361/752, 753, 361/799, 800, 816, 818, 212, 220, 683–686, 759, 732, 740, 747, 801; 174/35 R, 35 GS, 51

(56) References Cited

U.S. PATENT DOCUMENTS

| | | | |
|---|---|---|---|
| 3,699,270 | * | 10/1972 | Goodrich .............................. 379/421 |
| 4,424,404 | * | 1/1984 | Moore et al. ........................... 174/51 |
| 5,050,042 | * | 9/1991 | Richmond et al. ................... 361/736 |
| 5,195,142 | * | 3/1993 | D'Avolio et al. ..................... 381/173 |
| 5,339,461 | * | 8/1994 | Luplow ................................. 455/351 |
| 5,353,200 | * | 10/1994 | Bodin et al. .......................... 361/816 |
| 5,566,052 | * | 10/1996 | Hughes ................................. 361/704 |
| 5,566,362 | * | 10/1996 | Bauer et al. ........................... 455/90 |
| 5,621,617 | * | 4/1997 | Goss et al. ............................ 361/721 |
| 5,727,110 | * | 3/1998 | Smith et al. .......................... 385/147 |
| 5,798,910 | * | 8/1998 | Holbeche et al. .................... 361/809 |
| 5,808,556 | * | 9/1998 | Nelson et al. ........................ 340/643 |
| 5,854,848 | * | 12/1998 | Tate et al. ............................. 381/357 |
| 5,877,703 | * | 3/1999 | Bloss, Jr. et al. ............... 340/870.02 |
| 6,021,045 | * | 2/2000 | Johnson ................................ 361/704 |
| 6,091,358 | * | 7/2000 | Maniscalco et al. ............. 342/357.1 |

* cited by examiner

Primary Examiner—Jeffrey Gaffin
Assistant Examiner—Phuong T. Vu

(57) ABSTRACT

An electromagnetic interference (EMI) shielding enclosure includes a base having a first threaded lip. A cover has a second threaded lip. The second threaded lip screws onto the first threaded lip and attaches the cover to the base. The base is provided with a first inner recessed wall and the cover is provided with a second inner recessed wall. When the cover is screwed onto the base, the first and second recessed walls form a hollow cavity within the EMI shielding enclosure. The hollow cavity has a curvilinear profile in cross section, such as an ellipsoidal profile, which improves the EMI attenuation characteristics of the EMI shielding enclosure.

19 Claims, 4 Drawing Sheets

ELECTROMAGNETIC INTERFERENCE SHIELDING ENCLOSURE

BACKGROUND OF THE INVENTION

1. Field of the Invention

The present invention relates to an electromagnetic interference (EMI) shielding enclosure. More particularly, the present invention relates to an easily accessible EMI shielding enclosure having improved EMI shielding attributes.

2. Description of the Background Art

Numerous electrical components are sensitive to EMI fields. Electrical components operating at radio frequencies can be especially sensitive to EMI. Also, numerous electrical components are noisy and generate unwanted EMI fields as a by-product. Typically, such sensitive components and noisy components are housed in respective special enclosures and hence separated from other electrical components. The special enclosures shield the electrical components from receiving and transmitting EMI fields.

To date, various structures of EMI shielding enclosures have been proposed. The typical structure of the enclosure includes an open, box-type base and a lid for covering the base. The lid and base are formed of electrically conductive material, such as sheet steel, and are held together by a plurality of snap fasteners, solder joints, or one or more screws. Such typical EMI shielding enclosures require tools, such as screwdrivers or nutdrivers, to remove the fasteners, or complex tools to simultaneously hold in a plural of snap fasteners so that the lid can be removed from the base.

Such EMI shielding enclosures are successful at attenuating the majority of EMI fields. However, there is a need in the art for an improved EMI shielding enclosure which is easy to open and close to reduce the costs associated with assembling and accessing the EMI shielding enclosure. Furthermore, there is a need in the art for an EMI shielding enclosure which exhibits improved EMI attenuation characteristics.

SUMMARY OF THE INVENTION

Accordingly, it is an object of the present invention to provide an EMI shielding enclosure which is easy to open and close and does not require the use of tools to accomplish the task.

Another object of the present invention is to provide an EMI shielding enclosure which exhibits improved shielding characteristics, so as to exhibit a high degree of EMI attenuation.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
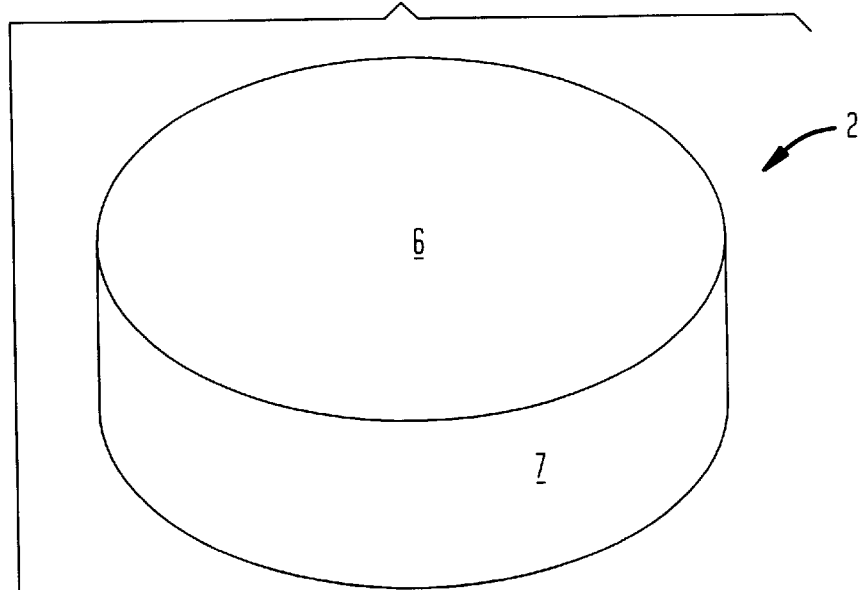
FIG. 1 is an exploded, perspective view of an EMI shielding enclosure, in accordance with the present invention.
Figure 1:
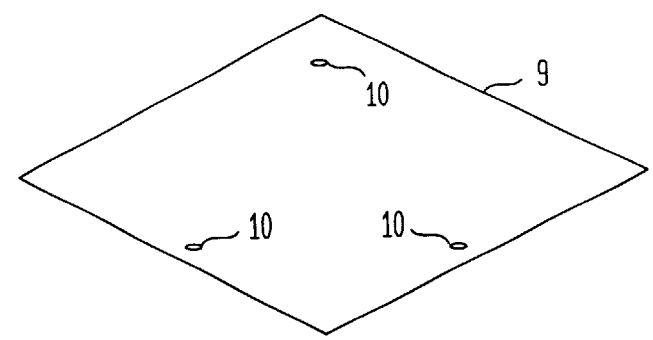
Figure 1:
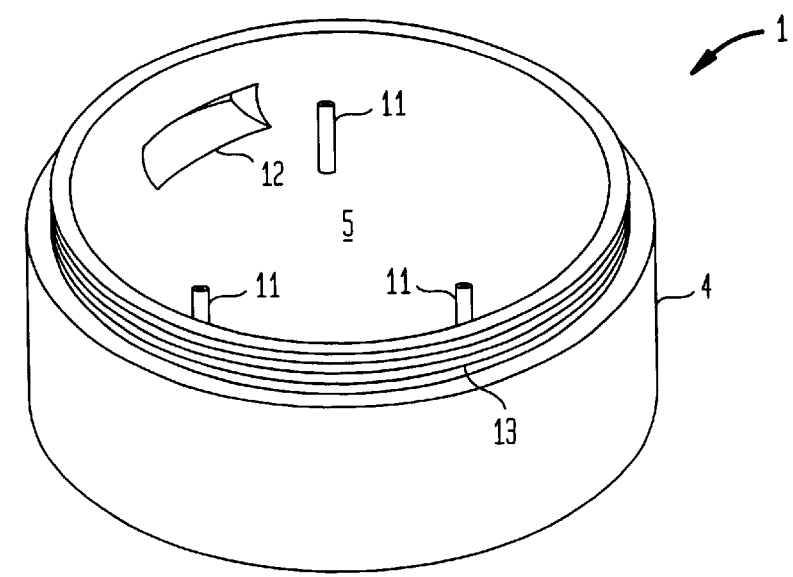

Referring in detail to the drawings, the beneficial accessibility feature of the EMI shielding enclosure in accordance with the present invention will be described. The EMI shielding enclosure includes a first portion serving as a base 1 and a second portion serving as a cover 2. The base 1 generally includes a flat bottom surface 3, a first circular outer wall 4, and a first curvilinear inner recessed wall 5. The base would be attached to a generally planar flat surface by screws, rivets, welding, adhesives, or the like. The cover 2 generally includes a flat upper surface 6, a second circular outer wall 7, and a second curvilinear inner recessed wall 8.

The base 1 and cover 2 encase a circuit board 9. The circuit board 9 is provided with openings 10, which align with standoffs 11 attached to, or integrally formed with, the first recessed wall 5. Typically, screws pass though the openings 10 and are threaded into the standoffs 11, or solder joints are formed between the circuit board 9 and standoffs 11. Alternatively, ends of the standoffs 11 can have projecting tabs, which are passed through the openings 10 whereupon the tabs lock within the openings 10. Electrical connections to the circuit board 9 are made by passing an electrical connector or wiring through an opening 12 provided in the base 1.

Once the circuit board 9 is secure to the standoffs 11 and the necessary electrical connections are made, the cover 2 is installed upon the base 1. An upper and outer perimeter of the base 1 is circular and provided with first threads 13. A lower and inner perimeter of the cover 2 is provided with second threads 14. The second threads 14 are adapted to engage with the first threads 13 so that the cover 2 may be rotated relative to the base 1 in a first angular direction to cause the cover 2 to move toward the base 1 generally along a first linear direction A (screwed onto the base 1). Further, the cover 2 may be rotated relative to the base 1 in a second angular direction, opposite the first angular direction, to cause the cover 2 to move away from the base 1 generally opposite the first linear direction A (screwed off of the base 1).

The ability to screw the cover 2 onto and off of the base 1 is particularly advantageous. First, no special tools are required to close or access the EMI shielding enclosure. Second, the operation of accessing and closing the EMI shielding enclosure can be accomplished quickly and easily. These benefits lead to a reduction in the time and costs associated with assembling an electronic unit employing the EMI shielding enclosure. Further, these benefits lead to a reduction in the time and costs associated with repairing or replacing the circuit board 9 housed within the EMI shielding enclosure. Although no tools are require to open the EMI shielding enclosure, it should be appreciated that one could use curve-jaw pliers to gain a mechanical advantage in twisting the cover 2 onto, or off of, the base 1. This could be of benefit when removing a stuck cover 2.

Also, if it is desired to make the EMI shielding enclosure tamper-resistant, one could include a tamper-resistant fastener, such as a screw having a complex head pattern, connecting the cover 2 to the base 1. By this arrangement, only a person having an appropriate tool would be able to remove the tamper-resistant fastener, and unscrew the cover 2 from the base 1.

Now, with reference to the drawings, the improved EMI attenuation attributes of the EMI shielding enclosure will be described. The base 1 and cover 2 are formed of a material having electrically conductive features. For example, the base 1 and cover 2 may be formed of a conductive metal, such as aluminum, nickel, copper, gold, magnesium, or alloys of conductive metals. Alternatively, the base 1 and cover 2 may be formed of a plastic polymer and then coated with one or more of the conductive metals or alloys. Alternatively, the base 1 and cover 2 may be formed of a plastic polymer, which is impregnated with one or more of the conductive metals or alloys.

Figure 2:
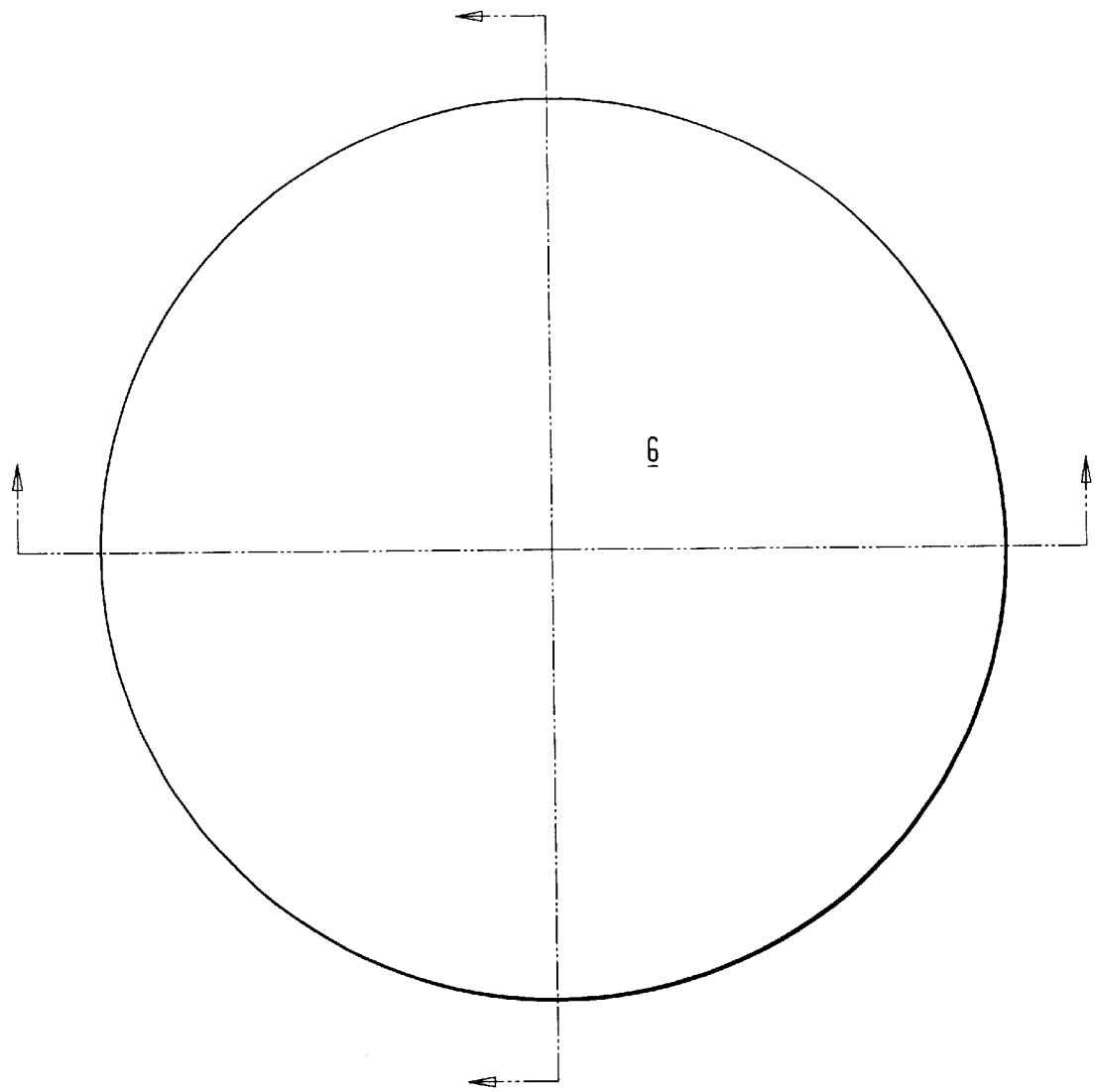
FIG. 2 is an overhead view of the EMI shielding enclosure of FIG. 1.
Figure 3:
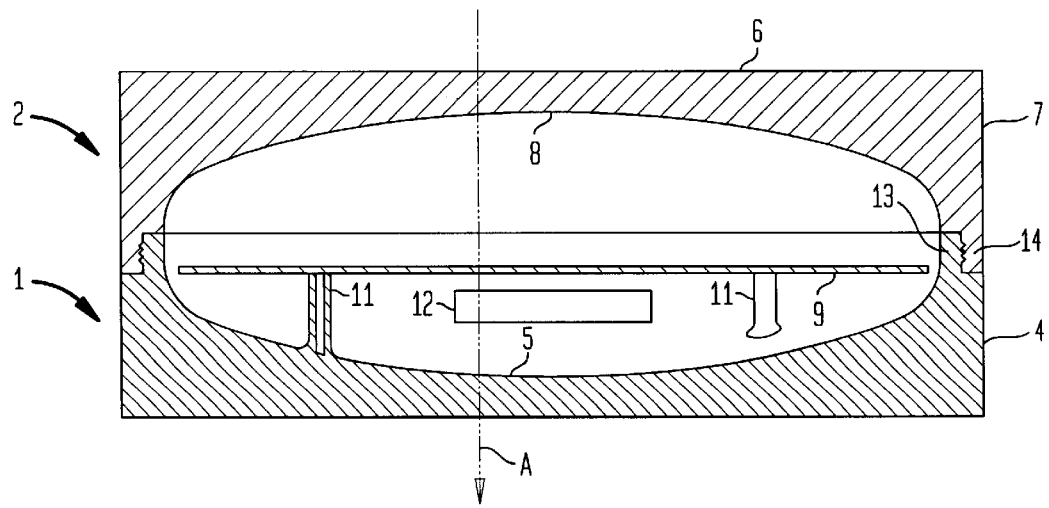
FIG. 3 is a cross-sectional view taken across line X—X in FIG. 2.
Figure 4:
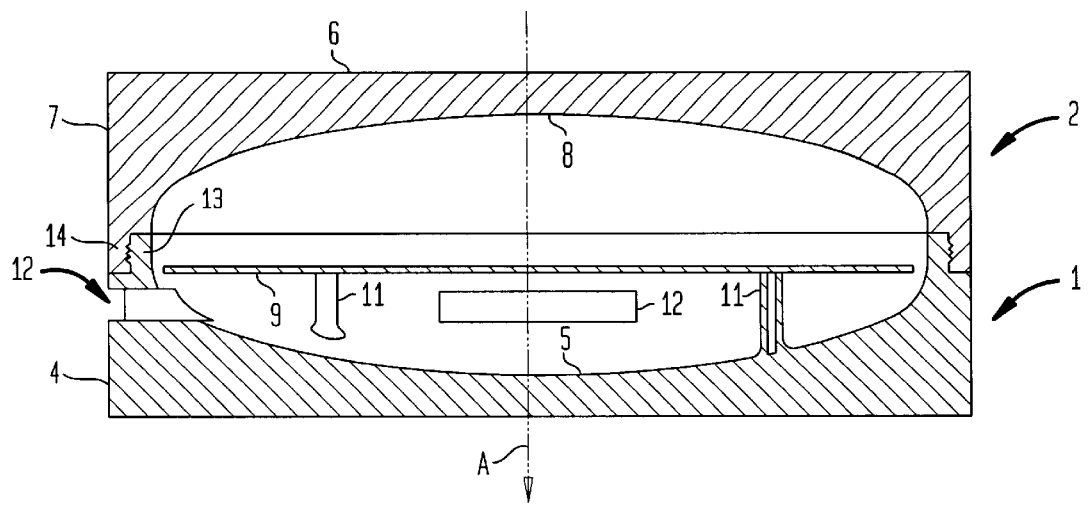
FIG. 4 is a cross-sectional view taken across line W—W in FIG. 2.

FIG. 2 is an overhead view of the cover 2 when installed upon the base 1. FIGS. 3 and 4 are cross sectional views taken across lines X—X and W—W of FIG. 2, respectively. Each of the cross sectional views of FIGS. 3 and 4 are taken along a plane including and parallel to the first linear direction A of FIG. 2. As seen in FIGS. 3 and 4, the juncture of the first and second threads 13, 14 causes a close, interlocking fit between the base 1 and cover 2. Such a close fit prevents the entrance or escapement of EMI fields at the juncture and improves the overall EMI attenuation properties of the EMI shielding enclosure. It should also be noted that a gasket could be provided at the juncture of the base 1 and cover 2 to improve the water resistance of the EMI shielding enclosure.

FIGS. 3 and 4 also illustrate a hollow inner cavity formed around the circuit board 9 when the cover 2 is screwed onto the base 1. The inner recessed walls 5 and 8 define the hollow inner cavity. As illustrated in FIGS. 3 and 4, a cross section of the inner cavity has a curvilinear profile. The curvilinear profile is beneficial in attenuating EMI.

Typical EMI shielding enclosures have rectilinear cross sectional profiles. A rectilinear cross sectional profile can exhibit standing wave properties and reduce the EMI attenuation. Further, the sharp edges of the rectilinear profile can cause a scattering effect of the EMI inside the enclosure which can lead to escapement of the EMI through small openings in the shielding enclosure.

FIGS. 3 and 4 illustrate the curvilinear profile of inner cavity of the present invention. The curvilinear profile presents no sharp edges to the EMI inside the shielding enclosure and therefore reduces the likelihood of the scattering effect. It should also be noted that the junctions between the standoffs 11 and the first recessed wall 5 are funnel-shaped in order to remove the presence of sharp edges within the inner cavity. Although the curvilinear profile is illustrated as being generally elliptical in shape, the benefits of improved attenuation, in accordance with the present invention, can be achieved by other curvilinear profiles, such as by a spherically shaped profile, or by an irregularly shaped profile.

Figure 5:
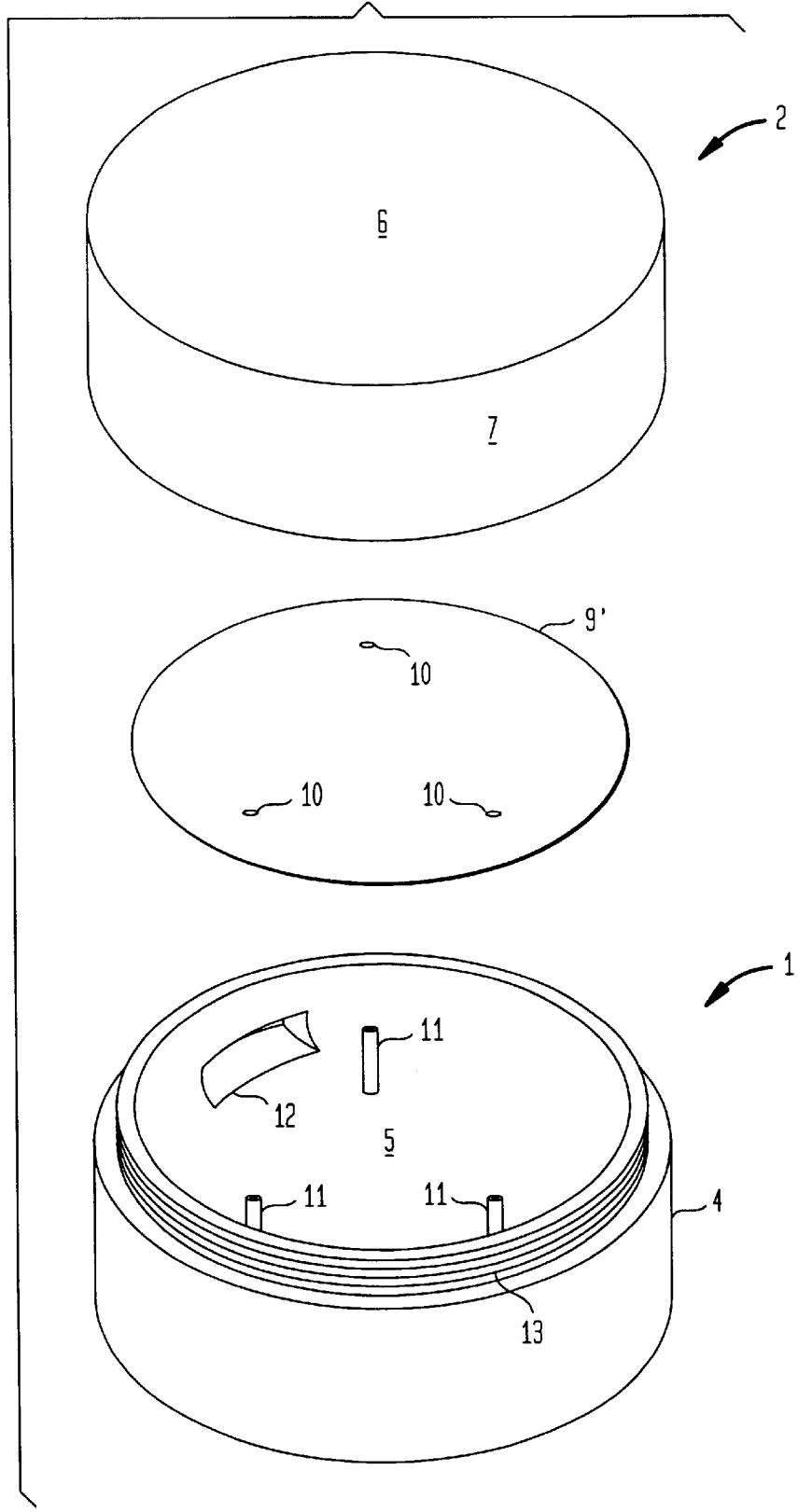
FIG. 5 is an exploded perspective view, similar to FIG. 1, illustrating a circular circuit board housed inside the EMI shielding enclosure.

FIG. 5 illustrates a modified circuit board 9' for containment inside the EMI shielding enclosure. The modified circuit board 9' has a circular outer perimeter and is symmetrical to the circular inner perimeter of the first recessed wall 5. The shape of the modified circuit board 91 allows more physical room to accommodate electrical components, as compared to the rectangular outer perimeter of the circuit board 9 of FIG. 1.

The EMI shielding enclosure is susceptible to many variations within the scope of the invention. For example, although the first and second outer walls 4,7 are illustrated as being circular, it should be appreciated that any shape may be given to the first and second outer walls 4,7. For instance, the first and second outer walls 4,7 may be rectangular. Rectangular outer walls could prove beneficial in stacking or arraying multiple EMI shielding enclosures onto or beside one another.

The relative dimensions illustrated should not be considered as limiting to the present invention. Further, the dimensions of the base 1 and cover 2 of the present invention may be widely varied. For example, in a first application of the present invention, the base 1 and cover 2 have a diameter of approximately 6 inches. The first application is suitable for use with large electronic components, as used in radio frequency transmitting towers. As another example, the EMI shielding enclosure could be miniaturized such that its diameter is approximately ½ inch. The miniaturized enclosure would be suitable for mounting directly onto a large printed circuit board, such as a computer's motherboard.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. An electromagnetic interference (EMI) shielding enclosure for housing electrical equipment therein, said shielding enclosure comprising:

a first portion formed of a first EMI material, said first portion having a first circular perimeter with first threads formed on said first circular perimeter; and a second portion formed of a second EMI shielding material, said second portion having a second circular perimeter with second threads formed on said second circular perimeter, said second threads matingly engage with said first threads such that relative rotation between said first and second portions causes said first and second portions to move toward each other generally along a first direction until said first and second portions are removably screwed together, wherein a cross section of said first and second portions taken along a plane parallel to the first direction generally presents a hollow interior space defined by a continous curvilinear profile, which is non-rectilinear and free of sharp edges.

2. The shielding enclosure of claim 1, wherein said first portion is for attachment to a circuit board, and wherein said first threads are formed on an outer surface of said first circular perimeter and said second threads are formed on an inner surface of said second circular perimeter.

3. The shielding enclosure of claim 1, wherein said first portion is for attachment to a circuit board, and wherein said first threads are formed on an inner surface of said first circular perimeter and said second threads are formed on an outer surface of said second circular perimeter.

4. The shielding enclosure of claim 1, wherein said continuous curvilinear profile is elliptical.

5. The shielding enclosure of claim 1, wherein said continuous curvilinear profile is spherical.

6. The shielding enclosure of claim 1, wherein said first material is a same material as said second material.

7. The shielding enclosure of claim 6, wherein said first EMI shielding material is formed of a first nonconductive material impregnated by pieces of conductive material.

8. The shielding enclosure of claim 6, wherein said first EMI shielding material is formed of a first nonconductive material coated with a conductive layer.

9. The shielding enclosure of claim 8, wherein said first nonconductive material is a molded polymer.

10. The shielding enclosure of claim 8, wherein said conductive layer includes at least one of aluminum, nickel, copper, magnesium or gold.

11. The shielding enclosure of claim 6, wherein said first EMI shielding material is formed of at least one of aluminum, nickel, copper, magnesium, gold, or an alloy.

12. An electromagnetic interference (EMI) shielding enclosure for housing electrical equipment therein, said shielding enclosure comprising:

a first portion formed of a first EMI shielding material, said first portion having a first perimeter; and a second portion formed of a second EMI shielding material, said second portion having a second perimeter, such that movement of said first portion toward said second portion generally along a first direction results in said second perimeter mating with said first perimeter such that said first and second portions are removably secured together, wherein a cross section of said first and second portions taken along a plane parallel to the first direction presents a hollow interior space defined by a continuous curvilinear profile, which is substantially elliptical or spherical and free of sharp edges.

13. The shielding enclosure of claim 12, wherein said continuous curvilinear profile is elliptical.

14. The shielding enclosure of claim 12, wherein said first material is a same material as said second material.

15. The shielding enclosure of claim 14, wherein said first EMI shielding material is formed of a nonconductive material impregnated by pieces of conductive material.

16. The shielding enclosure of claim 14, wherein said first EMI shielding material is formed of a nonconductive material coated with a conductive layer.

17. The shielding enclosure of claim 16, wherein said nonconductive material is a molded polymer.

18. The shielding enclosure of claim 16, wherein said conductive layer includes at least one of aluminum, nickel, copper, magnesium or gold.

19. The shielding enclosure of claim 14, wherein said first EMI shielding material is formed of at least one of aluminum, nickel, copper, magnesium, gold, or an alloy.

* * * * *